United States Patent
Heilman et al.

(10) Patent No.: US 6,683,896 B2
(45) Date of Patent: Jan. 27, 2004

(54) METHOD OF CONTROLLING THE TURN OFF CHARACTERISTICS OF A VCSEL DIODE

(75) Inventors: Randy T. Heilman, Palm Bay, FL (US); Taewon Jung, Malabar, FL (US); Raymond B. Patterson, III, Melbourne, FL (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 10/096,739

(22) Filed: Mar. 12, 2002

(65) Prior Publication Data

US 2002/0094000 A1 Jul. 18, 2002

Related U.S. Application Data

(63) Continuation of application No. 10/012,776, filed on Nov. 6, 2001.
(60) Provisional application No. 60/246,301, filed on Nov. 6, 2000, provisional application No. 60/246,325, filed on Nov. 6, 2000, and provisional application No. 60/246,407, filed on Nov. 6, 2000.

(51) Int. Cl.$^7$ .................................................. H01S 3/00
(52) U.S. Cl. ...................................... 372/29.01; 372/38
(58) Field of Search ........................ 372/29.01; 272/31, 272/29

(56) References Cited

U.S. PATENT DOCUMENTS

| 4,344,173 A | 8/1982 | Straus |
|---|---|---|
| 4,359,773 A | 11/1982 | Swartz et al. |
| 4,612,671 A | 9/1986 | Giles |
| 4,677,632 A | 6/1987 | Lisco et al. |
| H436 H | 2/1988 | Milberger et al. |
| 4,789,987 A | 12/1988 | Fraser |
| 4,796,226 A | 1/1989 | Valette |
| 4,799,224 A | 1/1989 | Bottacchi et al. |
| 4,803,497 A | 2/1989 | Kennedy, Jr. et al. |
| 4,884,278 A | 11/1989 | Nishimoto et al. |
| 4,924,470 A | 5/1990 | Ries |
| 4,945,541 A | 7/1990 | Nakayama |
| 5,043,992 A | 8/1991 | Royer et al. |
| 5,140,175 A | 8/1992 | Yagi et al. |
| 5,187,713 A | 2/1993 | Kwa |
| 5,191,589 A | 3/1993 | Amano et al. |
| 5,337,323 A | 8/1994 | Rokugawa et al. |
| 5,408,485 A | 4/1995 | Ries |
| 5,412,675 A | 5/1995 | Odagawa |
| 5,488,625 A | 1/1996 | Nakamori et al. |
| 5,515,196 A | 5/1996 | Kitajima et al. |
| 5,530,539 A * | 6/1996 | Hug .......................... 356/5.07 |
| 5,563,898 A | 10/1996 | Ikeuchi et al. |
| 5,566,263 A | 10/1996 | Smith et al. |
| 5,598,040 A | 1/1997 | Markis |
| 5,617,237 A | 4/1997 | Bogdan et al. |
| 5,652,668 A | 7/1997 | Aulet et al. |

(List continued on next page.)

OTHER PUBLICATIONS

International Search Report for International Application No. PCT/US01/46763 completed on Feb. 22, 2002 (Mailed Mar. 14, 2002) 3 pages.

(List continued on next page.)

*Primary Examiner*—Paul Ip
*Assistant Examiner*—Dung T Nguyen
(74) *Attorney, Agent, or Firm*—Christie, Parker & Hale, LLP

(57) ABSTRACT

A drive circuitry that drives a vertical cavity surface emitting laser is provided. The drive circuitry includes a modulator, a negative peak timer and a limiter. The negative peak timer causes the modulator to rapidly decrease the magnitude of the output signal of the modulator to dissipate charge stored on the laser. Thus, the vertical cavity surface emitting laser quickly turns off.

22 Claims, 8 Drawing Sheets

U.S. PATENT DOCUMENTS

| | | |
|---|---|---|
| 5,663,824 A | 9/1997 | Koch et al. |
| 5,675,600 A | 10/1997 | Yamamoto et al. |
| 5,732,096 A | 3/1998 | Suzuki et al. |
| RE35,766 E | 4/1998 | Taguchi |
| 5,736,844 A | 4/1998 | Yanagisawa |
| 5,796,767 A | 8/1998 | Aizawa |
| 5,828,246 A | 10/1998 | Bostica et al. |
| 5,835,250 A | 11/1998 | Kanesaka |
| 5,850,409 A | 12/1998 | Link |
| 5,854,693 A * | 12/1998 | Yoshiura et al. ............ 358/468 |
| 5,883,910 A | 3/1999 | Link |
| 5,907,569 A | 5/1999 | Glance et al. |
| 5,909,602 A * | 6/1999 | Nakai et al. .................... 399/8 |
| 5,936,986 A * | 8/1999 | Cantatore et al. ........ 372/38.02 |
| 5,974,063 A | 10/1999 | Yoshida |
| 5,987,044 A | 11/1999 | Odagawa et al. |
| 5,999,550 A | 12/1999 | Bellemore et al. |
| 6,021,144 A | 2/2000 | Meyer et al. |
| 6,044,095 A | 3/2000 | Asano et al. |
| 6,072,816 A | 6/2000 | Shin'e |
| 6,091,747 A | 7/2000 | Morita et al. |
| 6,188,498 B1 | 2/2001 | Link et al. |
| 6,272,160 B1 | 8/2001 | Stronczer |
| 6,292,497 B1 | 9/2001 | Nakano |
| 6,320,890 B1 | 11/2001 | Taguchi |
| 6,324,318 B1 * | 11/2001 | Suzuki ........................ 385/24 |
| 2001/0026566 A1 | 10/2001 | Taguchi et al. |
| 2002/0009109 A1 | 1/2002 | Asano |

OTHER PUBLICATIONS

International Search Report for International Application No. PCT/US01/47286 completed on Feb. 25, 2002 (Mailed Mar. 14, 2002) 4 pages.

International Search Report for International Application No. PCT/US01/47188 completed on Feb. 26, 2002 (Mailed Mar. 22, 2002) 3 pages.

* cited by examiner

US 6,683,896 B2

METHOD OF CONTROLLING THE TURN OFF CHARACTERISTICS OF A VCSEL DIODE

CROSS-REFERENCE TO RELATED APPLICATIONS

This application is a continuation application of U.S. patent application Ser. No. 10/012,776 filed Nov. 6, 2001 which claims the benefit of U.S. provisional application No. 06/246,301 filed Nov. 6, 2000, No. 06/246,325 filed Nov. 6, 2000 and No. 06/246,407 filed Nov. 6, 2000, which are hereby incorporated by reference as if set forth in full herein.

BACKGROUND

The present invention relates generally to semiconductor lasers, and, in particular, to methods and circuits to decrease the turn off time for a vertical cavity surface emitting laser.

Semiconductor lasers are widely used in high speed data communications. Modulated light from the lasers are used to carry information through fiber optic lines. For some data formats, generally, when a laser emits light the data value is considered a logical one and when the laser is largely off the data value is considered a zero.

Vertical cavity surface emitting lasers (VCSELs) are one type of laser used in data communication networks. VCSELs are generally relatively easy to manufacture using semiconductor processes. Drive circuitry for VCSELs provide a VCSEL with sufficient current to turn "on", i.e., causing the VCSEL to emit light. Likewise, the drive circuitry removes or prevents current from flowing to the VCSEL to turn the VCSEL to turn "off", i.e., causing the VCSEL to largely not emit light. However, when VCSELs turn on, electrical charge is stored on the anode of the VCSEL. Removing this electrical charge decreases the turn-off time of the VCSEL, and thereby increases the maximum data rate the VCSEL can support. Furthermore, removing the excess charge can be difficult as it is often desirable to maintain a low bias current when the VCSEL is in the "off" state. The bias current allows the VCSEL to be turned on faster. Thus, although the extra electrical charge is removed from the VCSEL to turn off the VCSEL, bias current to the VCSEL still should be maintained.

SUMMARY OF THE INVENTION

The present invention provides methods and systems for driving semiconductor lasers such that turn-off time of a laser is decreased. In one embodiment, a drive circuitry that drives a semiconductor laser is provided. The drive circuitry includes a modulator coupled to the semiconductor laser and generates an output signal to control the semiconductor laser. A negative peak timer is coupled to the modulator and a limiter is coupled to the negative peak timer and the modulator. The negative peak timer causes the modulator to rapidly decrease magnitude of the output signal of the modulator to turn off the semiconductor laser.

In another embodiment, a drive circuitry is provided that drives a semiconductor laser. The drive circuitry includes a limiter which receives a differential input and is configured to generate first differential output signals and second differential output signals. A negative peak timer is coupled to the limiter and receives the first differential signals from the limiter. The negative peak timer is also configured to generate third differential output signals. A modulator is also coupled to the limiter and the negative peak timer and receives the second differential output signals from the limiter and the third differential output signals from the negative peak timer. The modulator is also configured to generate an output pulse. A vertical cavity surface emitting laser is coupled to the modulator and receives the output pulse from the modulator to turn the laser on and off. The modulator is also configured to remove excess charge stored when the vertical cavity surface emitting laser is turned off. In one aspect of the invention, the output pulse is a voltage pulse that has an adjustable undershoot. The adjustable undershoot is determined by a negative peaking pulse from the negative peak timer.

In another embodiment, a method of driving a semiconductor laser is provided. An output signal is generated from a modulator to control the semiconductor laser. The modulator causes a rapid decrease in magnitude of the output signal of the modulator to turn off the semiconductor laser.

Many of the attendant features of this invention will be more readily appreciated as the same becomes better understood by reference to the following detailed description and considered in conjunction with the accompanying drawings.

DETAILED DESCRIPTION

Figure 1:
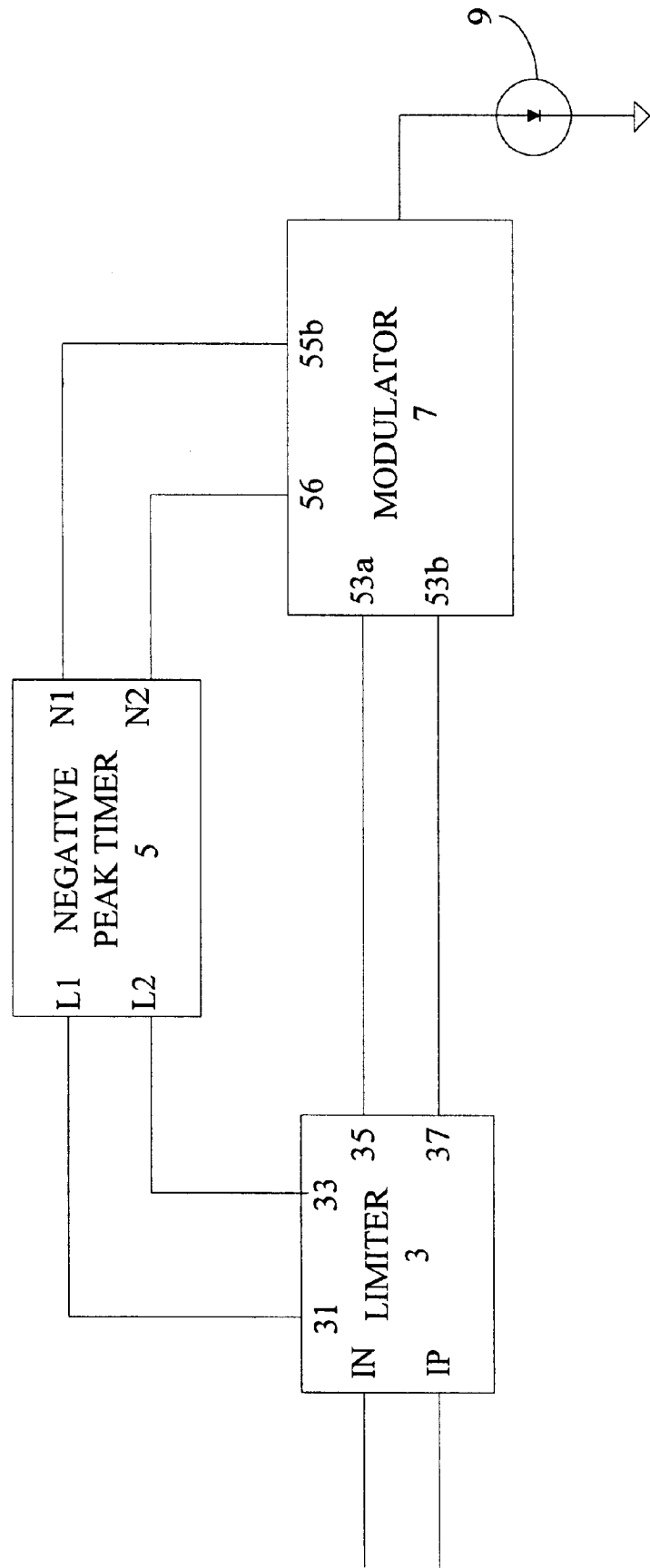
FIG. 1 illustrates a block diagram of drive circuitry for a semiconductor laser.

FIG. 1 illustrates a block diagram of drive circuitry for a semiconductor laser. The drive circuitry includes a limiter 3, a negative peak timer 5, and a modulator 7. The drive circuitry provides a signal to a vertical cavity service emitting laser (VCSEL) 9. The limiter 3 receives an input signal, a differential input signal as illustrated in FIG. 1, and generates two differential output signals. One of the differential output signals is supplied to the negative peak timer. The other differential output signal is supplied to the modulator. The negative peak timer generates an output pulse having an adjustable pulse width which is supplied to the modulator. Based on the output pulse from the negative peak timer and the differential output signal from the limiter, the modulator generates current to drive the VCSEL.

Figure 2:
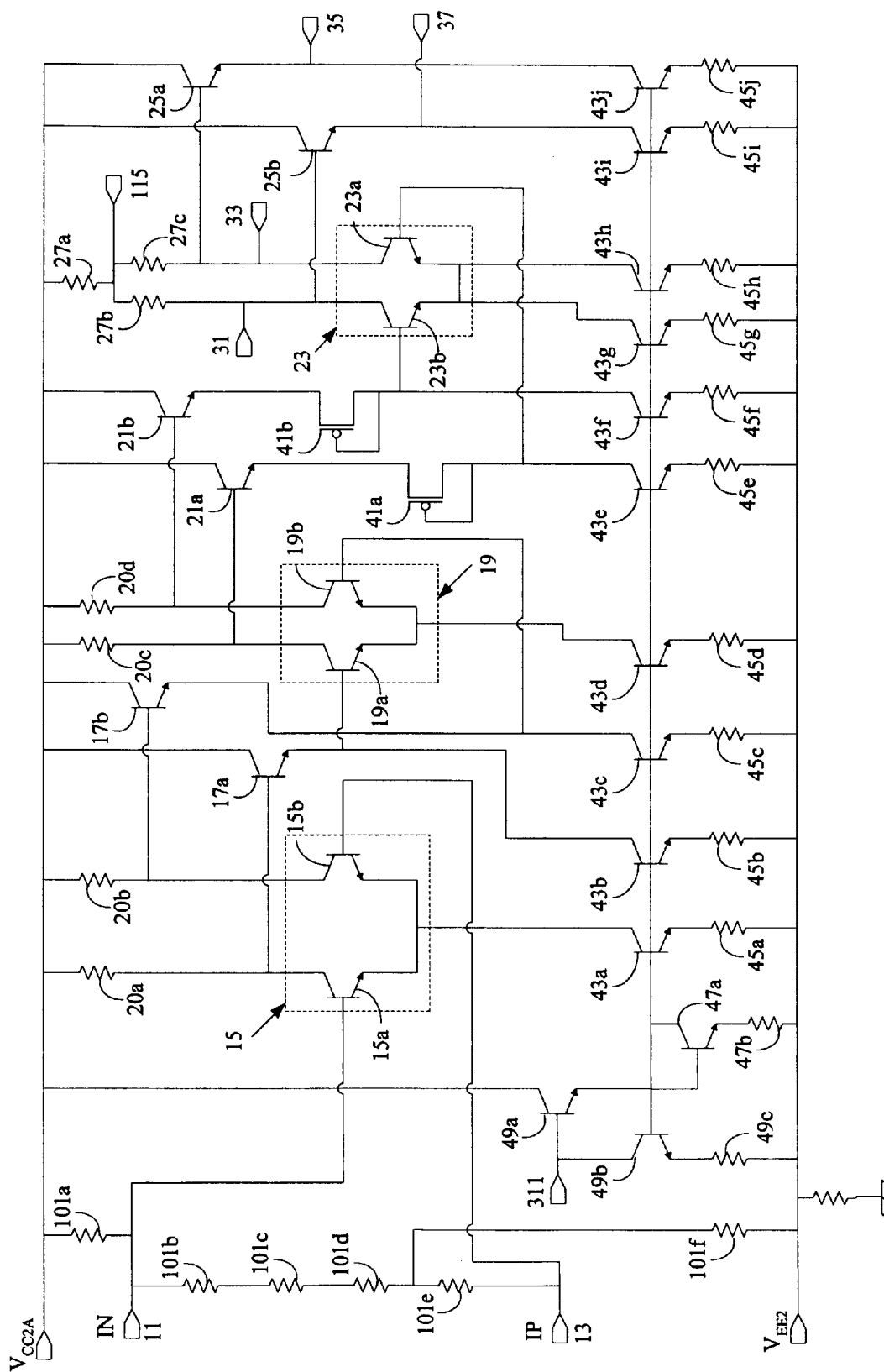
FIG. 2 illustrates a circuit diagram of one embodiment of the limiter of FIG. 1.

FIG. 2 illustrates a circuit diagram of one embodiment of the limiter of FIG. 1. The limiter receives a differential input at inputs IN 11 and IP 13 which are supplied to bases of transistors 15a and 15b. The resistors 101a–f are coupled to inputs 11 and 13 and the potentials $V_{CC2A}$ and $V_{EE2}$, and form voltage dividers that provides sufficient biasing for transistors 15a and 15b. The resistors also provide impedance matching to improve the quality of signals received at IN and IP.

As transistors 15a and 15b receive a differential signal, the transistors 15a and 15b turn on and off at different times. In other words, transistors 15a and 15b form a differential pair 15. The collector of transistor 15a is coupled to the base of emitter follower transistor 17a. Similarly, the collector of transistor 15b is coupled to the base of emitter follower transistor 17b. Accordingly, voltage is provided by the respective transistors 15a and 15b to the transistors 17a and 17b. The voltage level of the provided voltage is based on transistor 43a and resistor 45a acting as a current source and resistors 20a and 20b coupled to voltage potential $V_{CC2A}$.

The emitter of transistor 17a is coupled to the base of transistor 19a and the emitter of transistor 17b is coupled to the base of transistor 19b. Transistors 19a and 19b form the differential pair 19. The transistor 17a and 17b level shift the voltage from the differential pair 15 and allow connection from the collector load resistors, resistors 20a and 20b, of the differential pair 15 to be applied to the differential pair 19. Similar to the differential pair 15, the differential pair 19 turn on and off based on the differential signals applied to the respective bases of the transistors 19a and 19b.

Voltage from the differential pair 19 is supplied to the emitter follower transistors 21a and 21b. The voltage level of the supplied voltage is based on the transistor 43d and resistor 45d acting as a current source and resistors 20c and 20d coupled to voltage $V_{CC2A}$. Transistors 21a and 21b level shift the voltage from the differential pair 19 and allow connection from the collector load resistors, resistors 20c and 20d, of the differential pair 19 to be applied to differential pair 23. FET 41a and 41b, respectively coupled to the emitters of transistors 21a and 21b further effect a level shift to the voltage from the differential pair 19, which is supplied to differential pair 23. Differential pair 23 is formed by transistors 23a and 23b. Voltage output from the differential pair 23 is based on the transistors 43g,h and resistors 45g,h acting as current sources and resistors 27a–c coupled to voltage $V_{CC2A}$. The voltage is also supplied as an output via outputs 31 and 33 to a negative peak timer (FIG. 1).

Additionally, the voltage is supplied to respective emitter follower transistors 25a and 25b. Like the other emitter follower transistors 25a and b respectively level shift the voltage from the differential pair 23 and output the voltage via outputs 35 and 37 to a modulator (FIG. 1). Resistor 27a provides a common mode level shift for outputs 31, 33, 35 and 37.

The emitters of transistors 43a–j are coupled to the respective resistors 45a–j and act as current sources. For instance, when emitter follower transistors 17a,b, 21a,b, and 25a,b are on, current is forced through the transistors by respective current sources, transistors 43b,c,e,f,i and j. Transistors 49a,b and 47a and resistors 47b and 49c bias transistors 43a–j based on current from input 311. Therefore, the input 311 allows for control of currents provided by transistors 43a–j.

Thus, the limiter receives differential input signals via inputs 11 and 13 and amplifies and shapes the inputs using differential pairs 15, 19, and 23 and emitter follower transistors. As a result, the limiter generates output voltage pairs at outputs 31, 33, 35 and 37, with the voltage at outputs 35 and 37 being in phase with outputs 31 and 33 but with a DC level voltage difference, the base to emitter voltage of respective transistors 25a and 25b.

Figure 3:
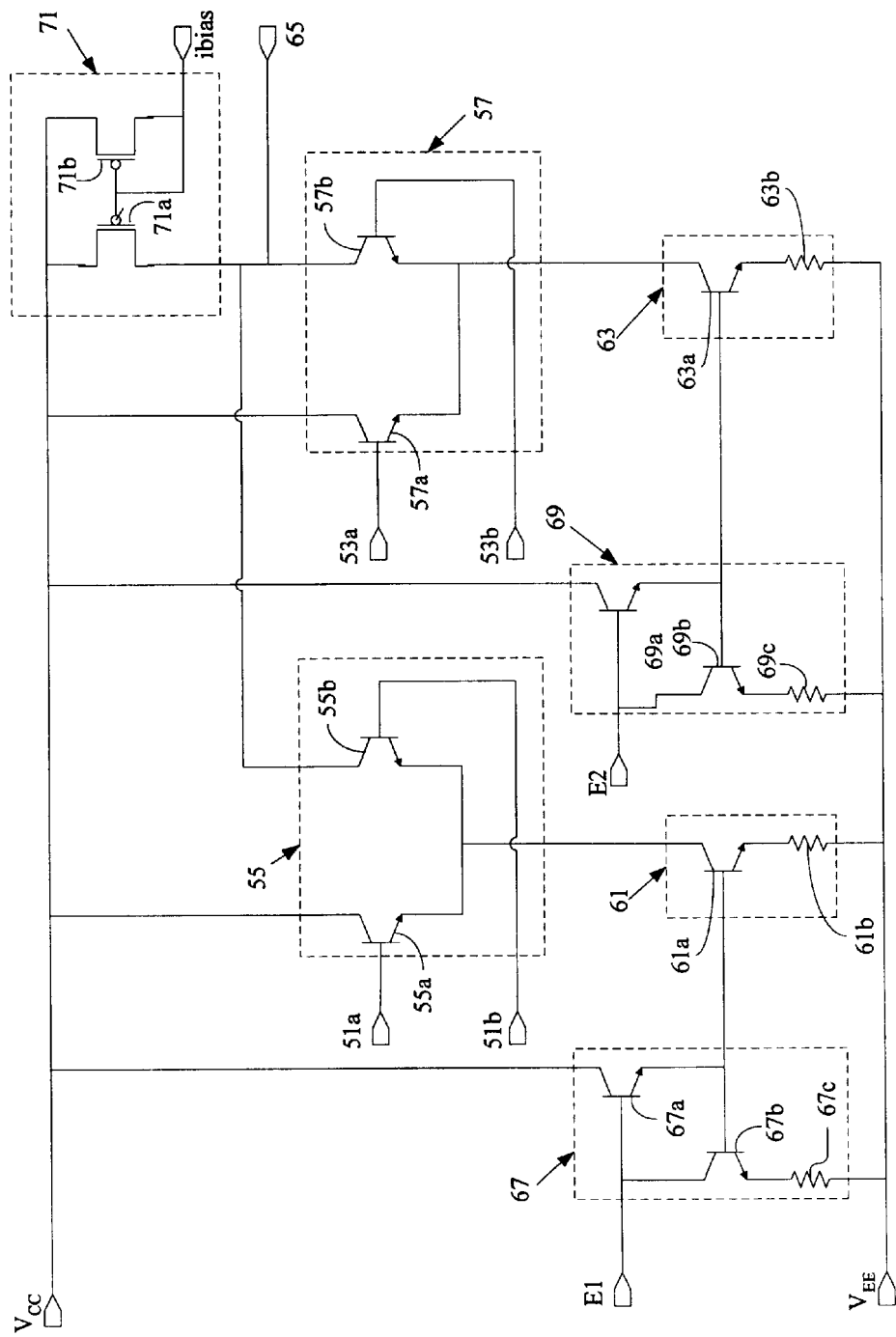
FIG. 3 illustrates a circuit diagram of one embodiment of the modulator of FIG. 1.

FIG. 3 illustrates a circuit diagram of one embodiment of the modulator of FIG. 1. The modulator includes two differential amplifiers 55 and 57. The first differential amplifier includes transistors 55a and 55b. Likewise, the second differential amplifier includes transistors 57a and 57b. Bases of transistors 55a and 55b receive respective differential inputs 51a and 51b. Bases of transistors 57a and 57b also receive respective differential inputs 53a and 53b. The output of both differential amplifiers 55 and 57 are coupled to the modulator output 65. The first and second differential amplifiers 55 and 57 are respectively coupled to current sources 61 and 63. Source 61 includes transistor 61a and resistor 61b and load 63 includes transistor 63a and resistor 63b. The sources 61 and 63, respectively, set the current for the respective differential amplifiers 55 and 57. Sources 61 and 63 are coupled to respective current mirror circuits 67 and 69. Mirror circuit 69 includes transistors 67a and 67b and resistor 67c. Transistor 67a receives a current from input E1. Likewise, mirror circuit 69 includes transistors 69a and 69b and resistor 69c. The base of transistor 69a receives a current from input E2.

The modulator also includes a current mirror 71 which includes transistors 71a and 71b. Current flowing through transistor 71b is mirrored by transistor 71a. The current mirror 71 supplies a bias current at the drain of transistor 71a. The current mirror is controlled by an ibias input coupled to the gates of the transistors 71a,b. The output signal 65 is coupled to the drain of transistor 71a. Also coupled to the drain of transistor 71a are the differential amplifiers 55 and 57. Thus, the output signal 65 depends on the input signals 51a, 51b and 53a, 53b and the extent to which the differential amplifiers 55 and 57 pull current from the current mirror 71 and the output 65. In one embodiment, the differential signals 51a and 51b are both aligned with the falling edge of the differential signals 53a and 53b. The amplitude of the output current thus corresponds to the drain current flowing through transistor 71a minus the collector current flowing through transistor 57b and the collector current flowing through transistor 53b. Also, the shape of the output current is determined by the input signals 51a, 51b, 53a and 53b. Thus, the modulator turns the semiconductor laser on or off using output 65 based on the differential inputs 51a and 51b received from the negative peak timer and the differential input signals 53 and 53b received from the limiter.

Figure 4:
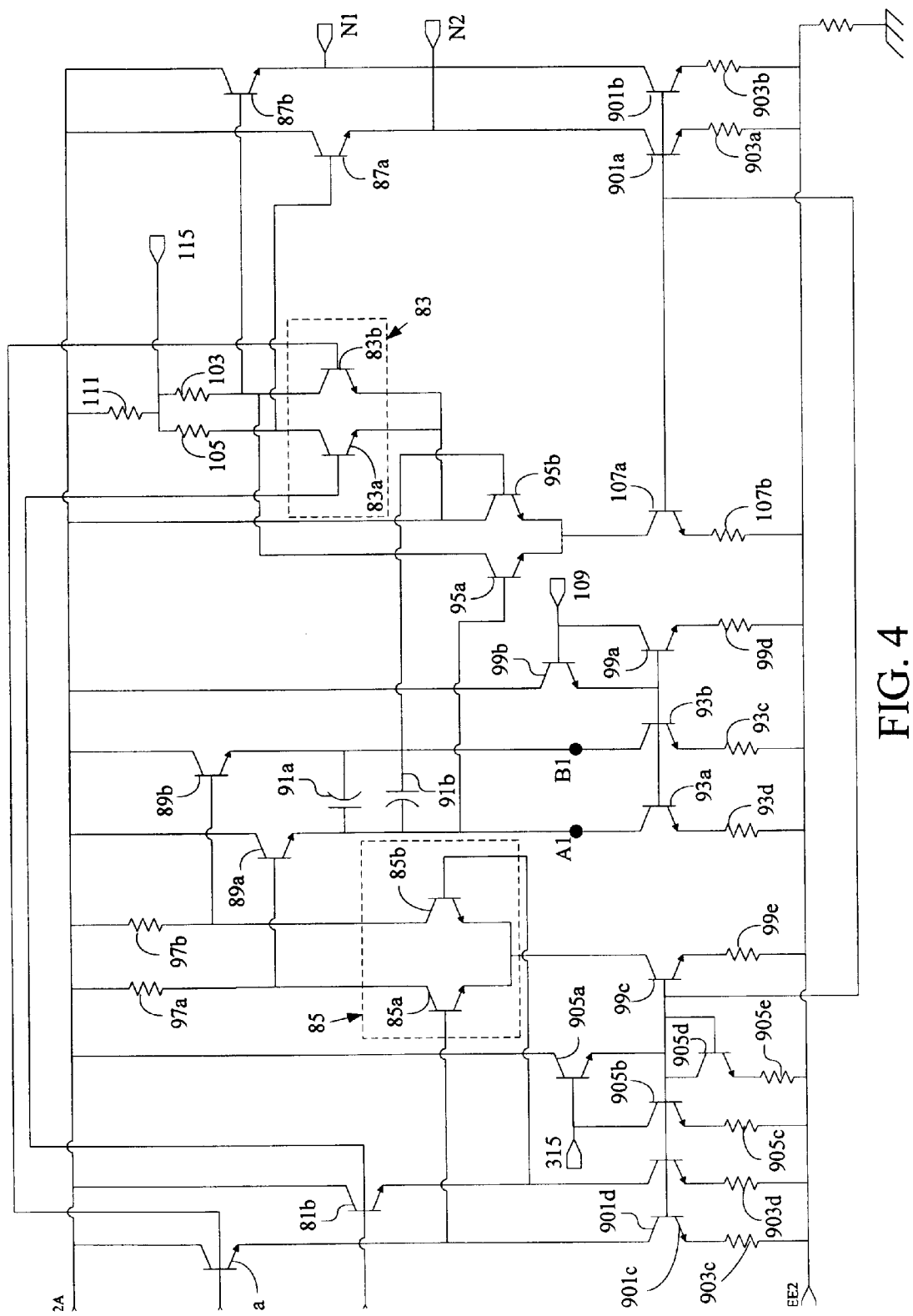
FIG. 4 illustrates a circuit diagram of one embodiment of the negative peak timer of FIG. 1.

FIG. 4 illustrates a circuit diagram of one embodiment of the negative peak timer of FIG. 1. The negative peak timer receives differential inputs L1 and L2 from the limiter of FIG. 1. The negative peak timer subsequently provides differential outputs N1 and N2 which are supplied to the modulator of FIG. 1. The differential inputs are buffered by respective transistors 81a and 81b. The emitters of transistors 81a and b are coupled to the collectors of the respective transistors 901c,d which are coupled to the respective resistors 903c,d and act as current sources. The differential inputs are also supplied to a differential amplifier 83. The differential amplifier includes transistors 83a and 83b. Current flowing through respective transistors 81a and 81b are also supplied to inputs of a differential amplifier 85. Differential amplifier 85 includes transistors 85a and 85b. Differential outputs from differential amplifier 83 are supplied to transistors 87a and 87b. Likewise, differential outputs from the differential amplifier 85 is supplied to transistors 89a and 89b. Two capacitors 91a and 91b are coupled in parallel and coupled to the sources of transistors 89a and 89b together. Also, coupled, respectively, to transistors 89a and 89b are transistors 93a and 93b. The transistors 93a and 93b are respectively coupled to resistors 93c and d and act as current sources for the respective transistors 89a and 89b. The capacitors 91a and 91b couples node A1 to node B1.

The signal swing is determined by resistors 97a and 97b respectively coupled to bases of transistors 89a and 89b and the current set by the transistor 99c and the resistor 99e, acting as a current source. Transistors 905a,b,d and resistors 905c and 905e sufficiently bias transistor 99c based on the input signal from input 315. The capacitors 91a and 91b cause a slope to be added to the original input signal provided at inputs L1 and L2. By adjusting the amount of collector current of transistors 93a and 93b, the slopes of current at nodes A1 and B1 also change. Higher collector current causes the capacitors 91a and 91b to charge faster which thus causes shorter rise and fall times. Conversely, lower collector currents cause the capacitors to charge slower and thus cause longer rise and fall times. Transistors 99a and 99b and resistor 99d control the amount of current flowing through transistors 93a and 93b and respective resistors 93d and 93c, based on the input 109 provided to the transistors. Nodes A1 and B1 are coupled to transistors 95a and 95b and are compared to the differential inputs supplied to transistors 83a and 83b. The time delay between the differential signals at node A1 and node B1, as compared to the differential inputs L1 and L2, are thus used to generate the pulse output N1 and N2. The pulse output is proportional to the capacitors 91a and 91b and collector currents of transistors 99c and 93b.

Initially, transistors 83a and 95a are both on. A voltage drop is thus caused at resistors 103 and ill as the collector current of transistor 95a flows through resistors 103 and 111. Initially, no current flows through transistor 83a. When the input signal L1 and L2 changes polarity, transistor 83b turns on. However, due to the time delay on nodes A1 and B1, current continues to flow through transistor 95a and resistors 103 and 111. Thus, voltage drop on resistors 103 and 111 remains. Once the time delay has ended, transistor 95b turns on. As a result, current is routed to transistor 83b and voltage drop on resistors 103 and 111 persists. When the input signal L1 and L2 changes polarity again, current from transistor 95b is routed through transistor 83a thus causing a voltage drop on resistors 105 and 111, as current flows through the resistors. When the time delay has passed, the transistor 95a turns on and a voltage drop on the resistors 103 and 111 is generated, as collector current flows through the resistor. As a result, a differential voltage is generated between the two transistors 87a and 87b. The differential voltage has an amplitude that corresponds to the voltage drop on the resistors 103 and 105. The transistors 87a and 87b thus drive the modulator coupled to the negative peak timer. The transistors 87a and 87b also provide level shifting. In one embodiment, the value of the resistors 103 and 105 correspond to each other and to a predetermined resistance value. As such, the resistor has a constant differential signal swing equal to the current determined by the transistor 107a times the predetermined resistance value. The transistors 107a coupled to resistor 107b act as a current source for the differential amplifier comprised of transistors 95a and 95b. Similarly, transistors 901a and 901b are respectively coupled to resistors 901a and 901b and act as current sources for the respective transistors 87a and 87b.

Figure 5A:
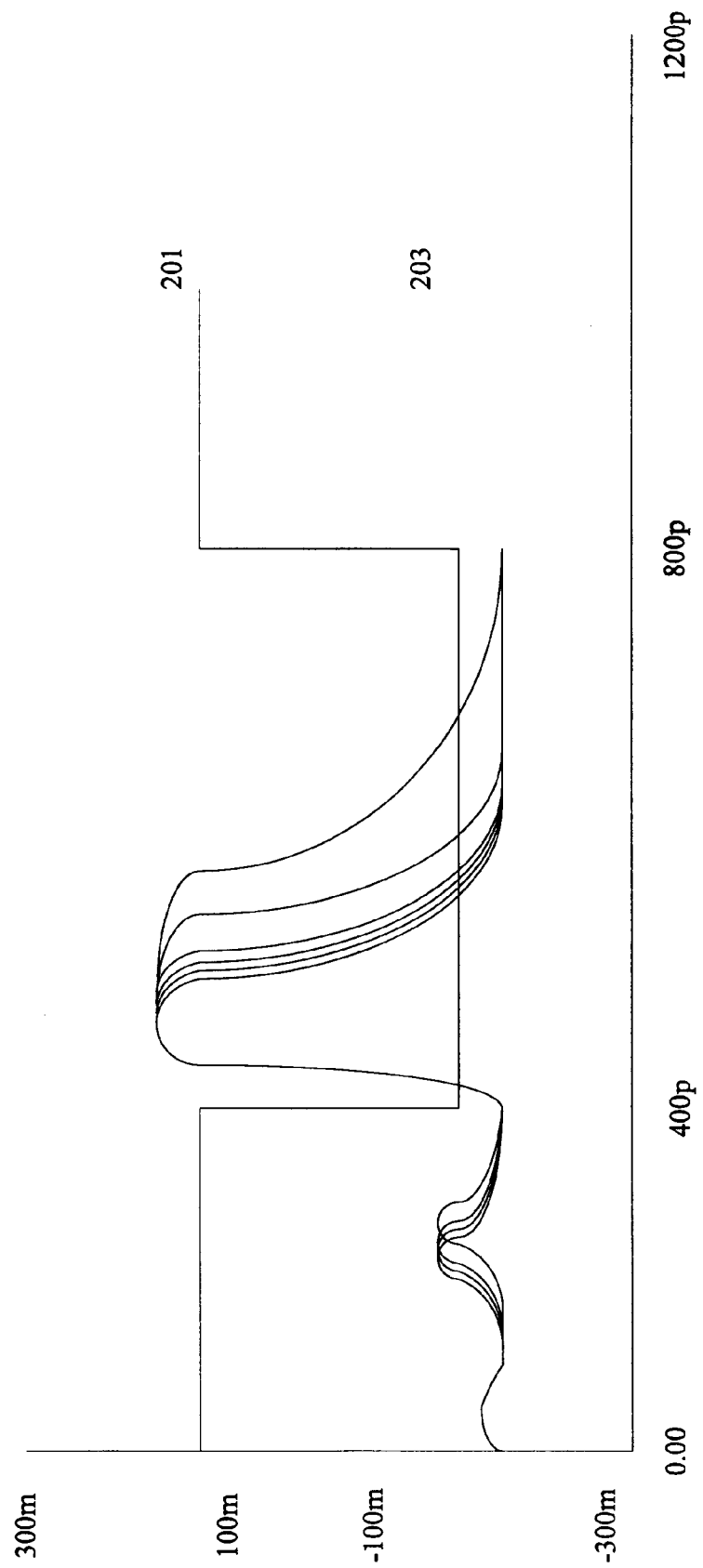
FIG. 5a illustrates a timing diagram of the output pulse generated by the negative peak timer of FIG. 4.

FIG. 5a illustrates a timing diagram of the output pulse 203 generated by the negative peak timer of FIG. 4. Voltage levels 201 of the output pulse are shown in relation to various levels of current applied to transistors 99a and 99b. The pulse width changes inversely to the current applied to the transistors 99a and 99b.

Figure 5B:
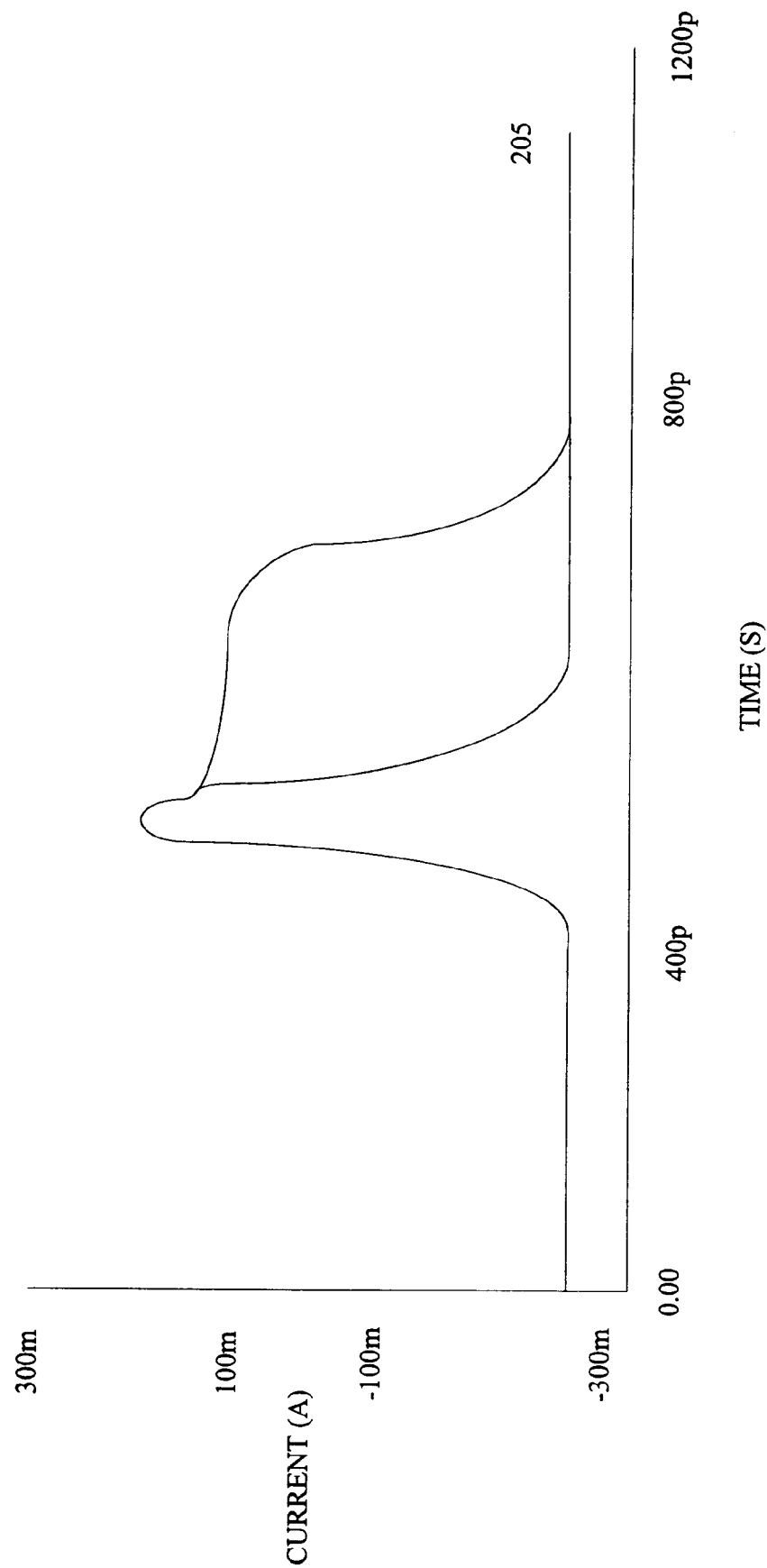
FIG. 5b illustrates a graphical representation of the collector current of transistor 55b of FIG. 3.

FIG. 5b illustrates a graphical representation of the collector current 205 of transistor 55b of FIG. 3. The collector current is directly affected by the output pulse from the negative peak timer of FIG. 4. By adjusting the collector current of transistor 61a, the magnitude of the collector current of transistor 53b may be adjusted. As discussed in reference to FIG. 3, the collector current of transistor 53b is subtracted from the current supplied by the transistor 71a. As such, an increase in the collector current of transistor 53b causes a decrease in the current supplied by transistor 71a to the output of the modulator. Thus, as the semiconductor laser is turning off, the amount of collector current of transistor 53b controls the depth of a negative peak which in turn decreases the speed at which the semiconductor laser turns off.

Figure 6:
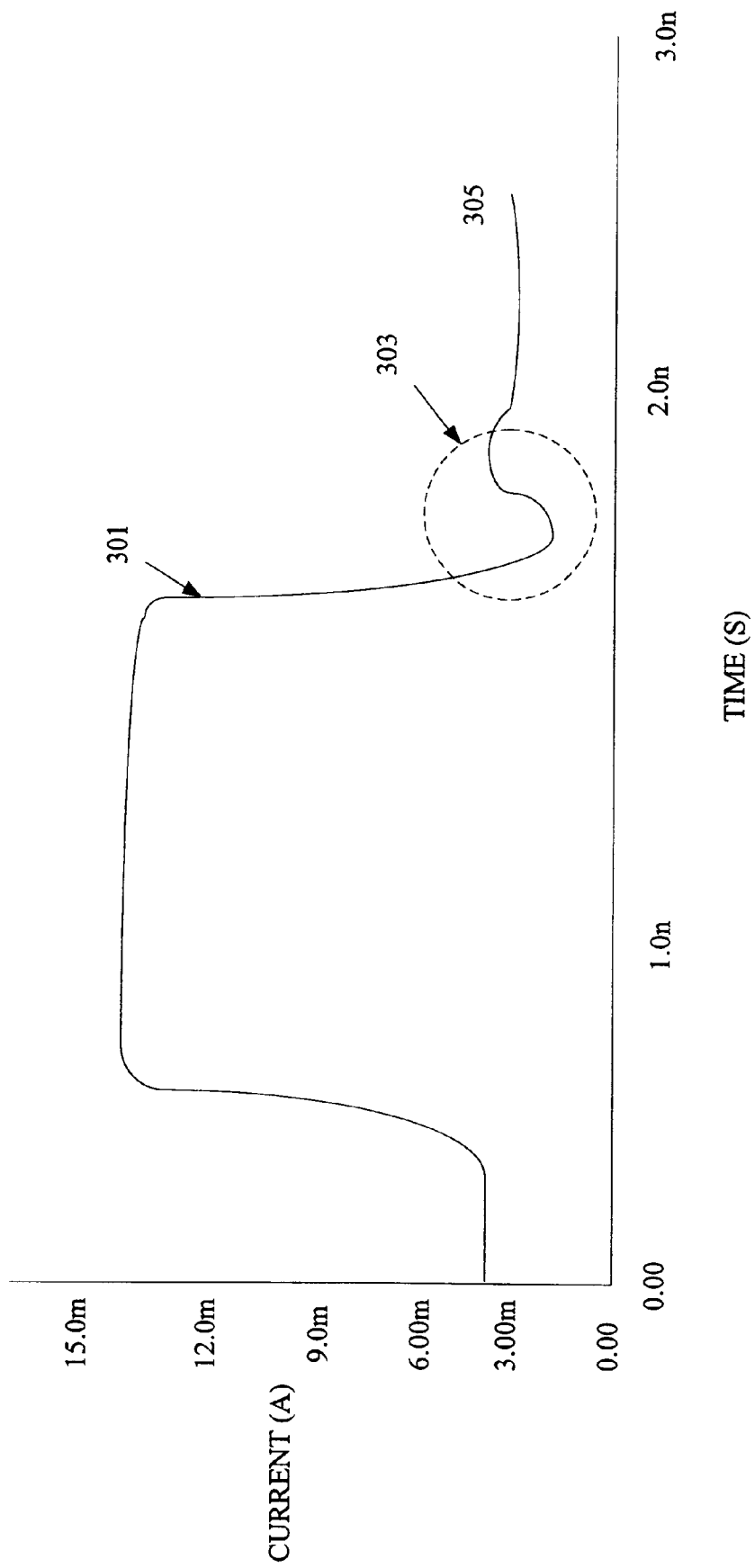
FIG. 6 illustrates a graphical representation of the output current from the modulator of FIG. 3 that is supplied to a semiconductor laser.

FIG. 6 illustrates a graphical representation of the output current from the modulator of FIG. 3 that is supplied to a semiconductor laser. The current signal 305 that graphically represents the current from the output of the modulator describes a pulse in which the semiconductor laser is turned on at approximately 4 nano seconds from an arbitrary starting point and begins to turn off at approximately 1.6 nano seconds. The slope 301a is close to one, i.e., vertical thus represents a rapid fall time. Undershoot 303 represents the effect on the output current of the modulator by the negative peak timer.

Figure 7:
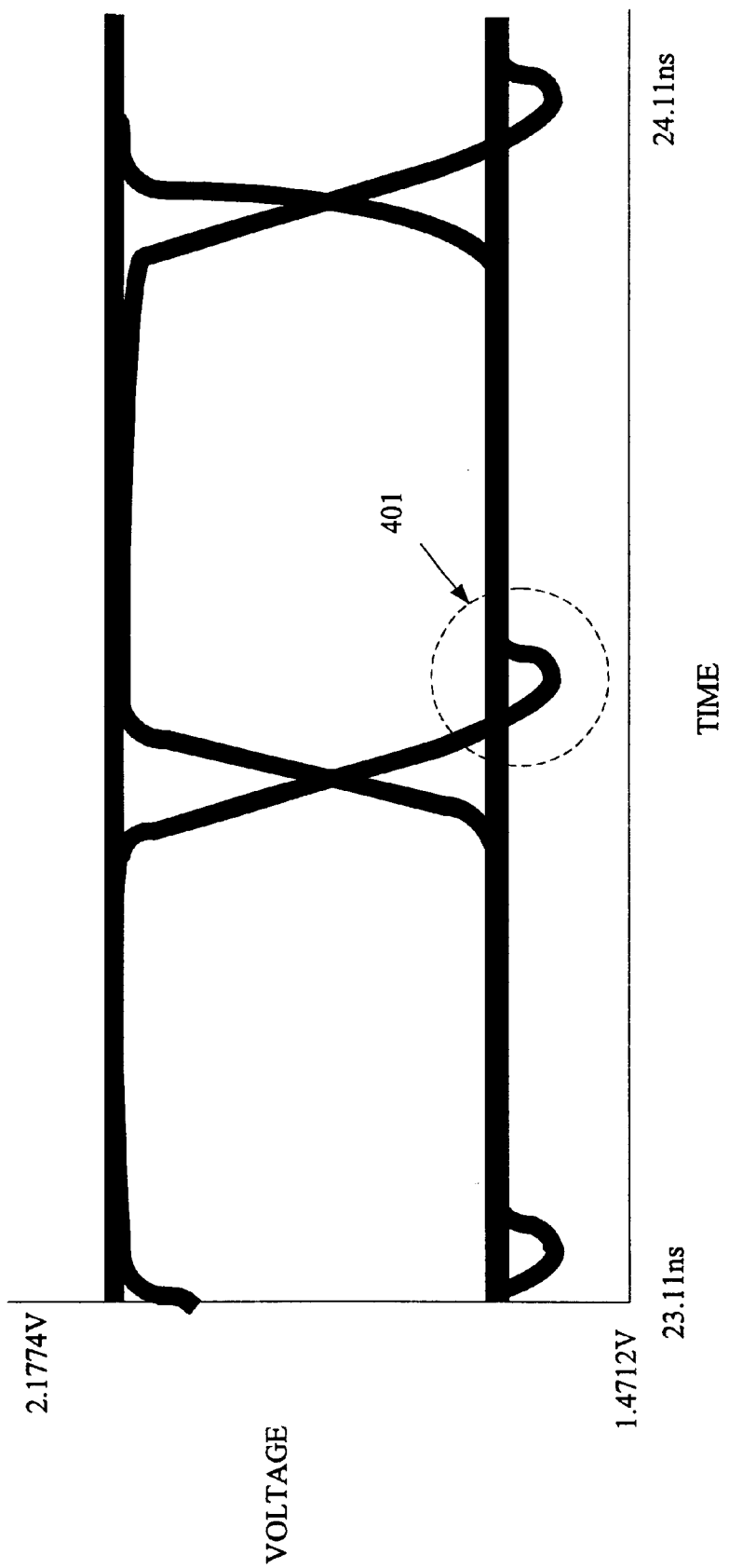
FIG. 7 illustrates a graphical representation of an eye diagram of the output voltage of the drive circuitry of FIG. 1.

FIG. 7 illustrates a graphical representation of an eye diagram of the output voltage of the drive circuitry of FIG. 1. Undershoot 401 of the eye diagram illustrates the effect of the negative peak timer on the output from the modulator. As previously discussed, the undershoot causes the semiconductor laser to turn off quickly as current supplied to the semiconductor laser is removed faster than it was supplied to the laser when the laser was turned on. Also, the amount of current is significantly below the amount of bias current supplied to the semiconductor laser and thus charge stored on the semiconductor laser is quickly removed.

Accordingly, the present invention provides methods and systems that decrease the turn off time for a vertical cavity surface emitting laser. Although this invention has been described in certain specific embodiments, many additional modifications and variations would be apparent to those skilled in the art. For instance, although bipolar devices are illustrated and described, CMOS devices could be used instead to provide the same functionality, but perhaps for a lower data rate. It is therefore to be understood that this invention may be practiced otherwise than as specifically described. Thus, the present embodiments of the invention should be considered in all respects as illustrative and not restrictive. The scope of the invention to be determined by the appended claims, their equivalents and claims supported by the specification rather than the foregoing description.

What is claimed is:

1. A drive circuitry driving a semiconductor laser, the drive circuitry comprising:
   a modulator coupled to the semiconductor laser and generating an output signal to control the semiconductor laser;
   a negative peak timer coupled to the modulator;
   a limiter coupled to the negative peak timer and the modulator;
   wherein the negative peak timer causes the modulator to rapidly decrease magnitude of the output signal of the modulator to turn off the semiconductor laser.

2. A drive circuitry driving a semiconductor laser, the drive circuitry comprising:
   a modulator coupled to the semiconductor laser and generating an output signal to control the semiconductor laser;
   a negative peak timer coupled to the modulator;
   a limiter coupled to the negative peak timer and the modulator;

wherein the negative peak timer causes the modulator to rapidly decrease magnitude of the output signal of the modulator to turn off the semiconductor laser; and wherein the negative peak timer comprises a plurality of differential amplifiers configured to receive input signals from the limiter and generate an output pulse.

3. The drive circuitry of claim 2 wherein the output pulse has a pulse width having a variable rise and fall time.

4. The drive circuitry of claim 3 wherein the variable rise and fall time is controlled by a plurality of capacitors.

5. The drive circuitry of claim 4 wherein the plurality of capacitors bridge nodes between the output of a first one of the plurality of differential amplifiers to input of a second one of the plurality of differential amplifiers.

6. The drive circuitry of claim 4 wherein the plurality of capacitors accelerate fall times of the output signal of the modulator.

7. The drive circuitry of claim 2 wherein one of the differential amplifiers draws current supplied to the semiconductor laser away from the semiconductor laser.

8. The drive circuitry of claim 1 wherein an undershoot condition is created in which charge stored on the semiconductor laser is dissipated.

9. The drive circuitry of claim 1 wherein the semiconductor laser is a vertical cavity surface emitting laser.

10. A drive circuitry driving semiconductor lasers, the drive circuitry comprising:

a limiter receiving a differential input signal and configured to generate first differential output signals and second differential output signals;

a negative peak timer coupled to the limiter and receiving the first differential output signals from the limiter, the negative peak timer configured to generate third differential output signals;

a modulator coupled to the limiter and the negative peak timer and receiving the second differential output signals from the limiter and the third differential output signals from the negative peak timer, the modulator configured to generate an output pulse; and a vertical cavity surface emitting laser coupled to the modulator and receiving the output pulse from the modulator turning the vertical cavity surface emitting laser on and off;

wherein the modulator is configured to remove excess charge stored when the vertical cavity surface emitting laser is turned off.

11. The drive circuitry of claim 10 wherein the output pulse is a voltage pulse having an adjustable undershoot.

12. The drive circuitry of claim 10 wherein the output pulse has an variable width and amplitude as determined by the negative peak timer.

13. The drive circuitry of claim 11 wherein the adjustable undershoot is determined by a negative peaking pulse from the negative peak timer.

14. The drive circuitry of claim 11 wherein the adjustable undershoot is determined by a positive peaking pulse from the negative peak timer.

15. A method of driving a semiconductor laser, the method comprising:

generating an output signal from a modulator to control the semiconductor laser; and causing the modulator to rapidly decrease magnitude of the output signal of the modulator to turn off the semiconductor laser.

16. A drive circuitry driving a semiconductor laser, the drive circuitry comprising:

means for generating an output signal to control the semiconductor laser;

means for causing a rapid decrease in magnitude of the output signal of the modulator to turn off the semiconductor laser.

17. The method of claim 15 further comprising:

generating an undershoot condition; and dissipating charge stored on the semiconductor laser based on the undershoot condition generated.

18. The method of claim 17 further comprising:

generating a negative peaking pulse; and adjusting the undershoot condition based on the negative peaking pulse generated.

19. The method of claim 17 further comprising:

generating a positive peaking pulse; and adjusting the undershoot condition based on the positive peaking pulse generated.

20. The drive circuitry of claim 16 further comprising means for generating an undershoot condition to cause dissipation of charge stored on the semiconductor laser.

21. The drive circuitry of claim 20 further comprising means for generating a negative peaking pulse to adjust the undershoot condition generated.

22. The drive circuitry of claim 20 further comprising means for generating a positive peaking pulse to adjust the undershoot condition generated.

* * * * *